United States Patent
Lee et al.

(10) Patent No.: US 11,418,104 B2
(45) Date of Patent: Aug. 16, 2022

(54) CURRENT MEASUREMENT METHOD FOR THREE-PHASE PULSE WIDTH MODULATION INVERTER USING REAL-TIME SWITCH JUNCTION TEMPERATURE ESTIMATION TECHNIQUE AND THREE-PHASE PULSE WIDTH MODULATION INVERTER SYSTEM

(71) Applicant: KOOKMIN UNIVERSITY INDUSTRY ACADEMY COOPERATION FOUNDATION, Seoul (KR)

(72) Inventors: Geun Ho Lee, Seongnam-si (KR); Jae Yeob Hwang, Gunpo-si (KR); Hee Sun Lim, Seoul (KR); Dong Gil Kang, Seoul (KR); Dong Ok Kim, Bucheon-si (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 0 days.

(21) Appl. No.: 17/761,589

(22) PCT Filed: Oct. 23, 2020

(86) PCT No.: PCT/KR2020/014614
§ 371 (c)(1),
(2) Date: Mar. 17, 2022

(87) PCT Pub. No.: WO2021/107412
PCT Pub. Date: Jun. 3, 2021

(65) Prior Publication Data
US 2022/0221494 A1 Jul. 14, 2022

(30) Foreign Application Priority Data

Nov. 27, 2019 (KR) .................. 10-2019-0154689
Feb. 20, 2020 (KR) .................. 10-2020-0020802

(51) Int. Cl.
*H02M 1/00* (2006.01)
*H02M 7/5395* (2006.01)
(Continued)

(52) U.S. Cl.
CPC ............ *H02M 1/0009* (2021.05); *G01K 7/16* (2013.01); *H02M 7/5395* (2013.01); *G01R 19/10* (2013.01)

(58) Field of Classification Search
CPC .... H02M 1/0009; H02M 7/5395; G01K 7/16; G01R 19/10
See application file for complete search history.

(56) References Cited

FOREIGN PATENT DOCUMENTS

| KR | 10-2011-0078968 A | 7/2011 |
| KR | 10-2019-0089659 A | 7/2019 |

OTHER PUBLICATIONS

Rok Pajer et al., MOS-FET as a Current Sensor in Power Electronics Converters, Article, Jul. 24, 2015, 19 pages, sensors.

*Primary Examiner* — Kyle J Moody
(74) *Attorney, Agent, or Firm* — Nicholas Park (57) ABSTRACT

Disclosed are a current measurement method for a three-phase pulse width modulation inverter using a real-time switch junction temperature estimation technique, and a three-phase pulse width modulation inverter system. The current measurement method may comprise the steps of: calculating a power loss of a switch of an inverter; estimating the junction temperature (T j) of the switch by using a thermal equivalent circuit; estimating a resistance (R ds on) value between both ends of a drain and a source by using a resistance (R ds on) map based on the junction temperature (Continued)

(T j); and using, as a control signal of the inverter, a current value calculated based on the estimated resistance (R ds on) value.

8 Claims, 6 Drawing Sheets

(51) Int. Cl.
*G01K 7/16* (2006.01)
*G01R 19/10* (2006.01)

FIG.1

Passing active vector

Low modulation index

CURRENT MEASUREMENT METHOD FOR THREE-PHASE PULSE WIDTH MODULATION INVERTER USING REAL-TIME SWITCH JUNCTION TEMPERATURE ESTIMATION TECHNIQUE AND THREE-PHASE PULSE WIDTH MODULATION INVERTER SYSTEM

CROSS-REFERENCE TO RELATED APPLICATION

This application is a US National stage Application filed under 35 U.S.C. § 371 of International Application No. PCT/KR2020/014614, filed on Oct. 23, 2020, and designating the United States, the International Application claiming a priority date of Nov. 27, 2019, based on prior Korean Application No. 10-2019-0154689, filed on Nov. 27, 2019, and claiming a priority based on prior Korean Application No. 10-2020-0020802, filed on Feb. 20, 2020, the disclosure of which is incorporated herein by reference in its entirety.

TECHNICAL FIELD

The present disclosure relates to a current measurement method of a 3-phase pulse width modulation (PWM) inverter using a real-time switch junction temperature estimation technique and a 3-phase PWM inverter system, and more particularly, to a 3-phase PWM inverter system that may calculate a power loss value occurring in real time using power parameters, may estimate a junction temperature of a switch using a thermal equivalent circuit of a Negative Temperature Coefficient (NTC) base, and may modify a resistance ($R_{ds}$ on) value using the estimated junction temperature in order to compensate for an error occurring due to a change in the resistance ($R_{ds}$ on) value between both ends of a drain and a source according to a temperature and a current measurement and detection modification method thereof.

RELATED ART

In general, a current measurement of a 3-phase pulse width modulation (PWM) inverter is performed using a separate current sensor. However, with technical advancement, a role of the current sensor is decreasing in terms of price and system scale.

Here, employed is a method of calculating current by measuring a voltage generated by a resistance ($R_{ds}$ on) between both ends of a drain and a source when a lower switch of an inverter is conducted using a single current sensor.

A method of calculating current by measuring a voltage generated based on a resistance ($R_{ds}$ on) value of both ends of a switch measures an amount of voltage drop when the lower switch is conducted and calculates current from a relation expression with the resistance ($R_{ds}$ on) value.

Figure 1:
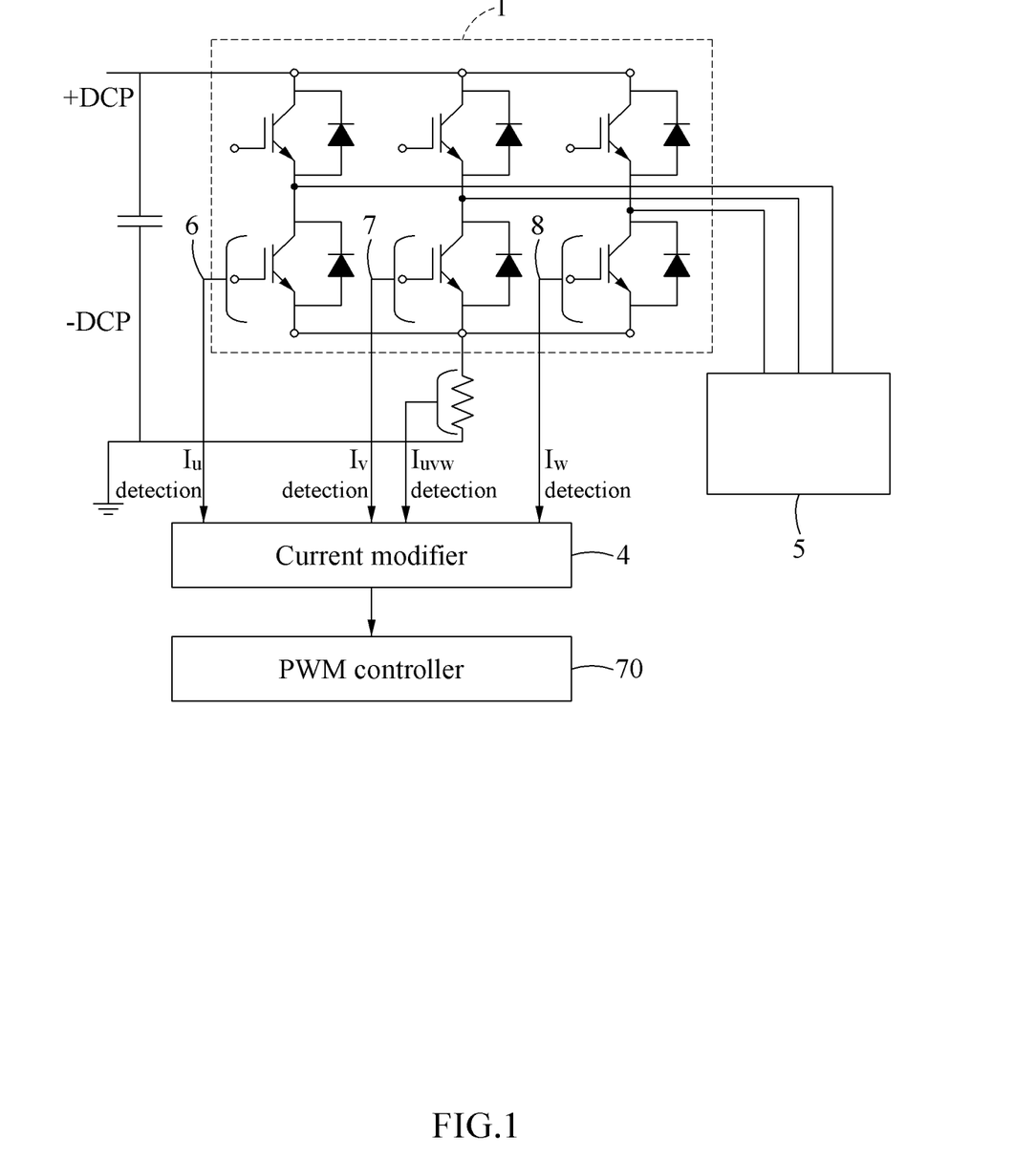
FIG. 1 is a conceptual diagram of a 3-phase pulse width modulation (PWM) inverter system using a single current sensor according to the related art.

FIG. 1 is a conceptual diagram of an inverter system that measures current by measuring a voltage generated based on a resistance ($R_{ds}$ on) value according to the related art. Referring to FIG. 1, current is measured using a voltage drop and a resistance ($R_{ds}$ on) value between a drain and a source of a lower switch of an inverter.

Here, the resistance ($R_{ds}$ on) value has a characteristic of varying according to various factors, such as gate-source voltage and temperature. Since a temperature acts as a biggest change factor due to characteristics of the inverter, a resistance ($R_{ds}$ on) modifier and a current calculator configured to continuously modify a resistance ($R_{ds}$ on) value through a voltage drop across the switch and a current value detected using a single current sensor and to calculate current using the modified resistance ($R_{ds}$ on) value and the drop voltage across the switch are required to measure the current more accurately.

Figure 2:
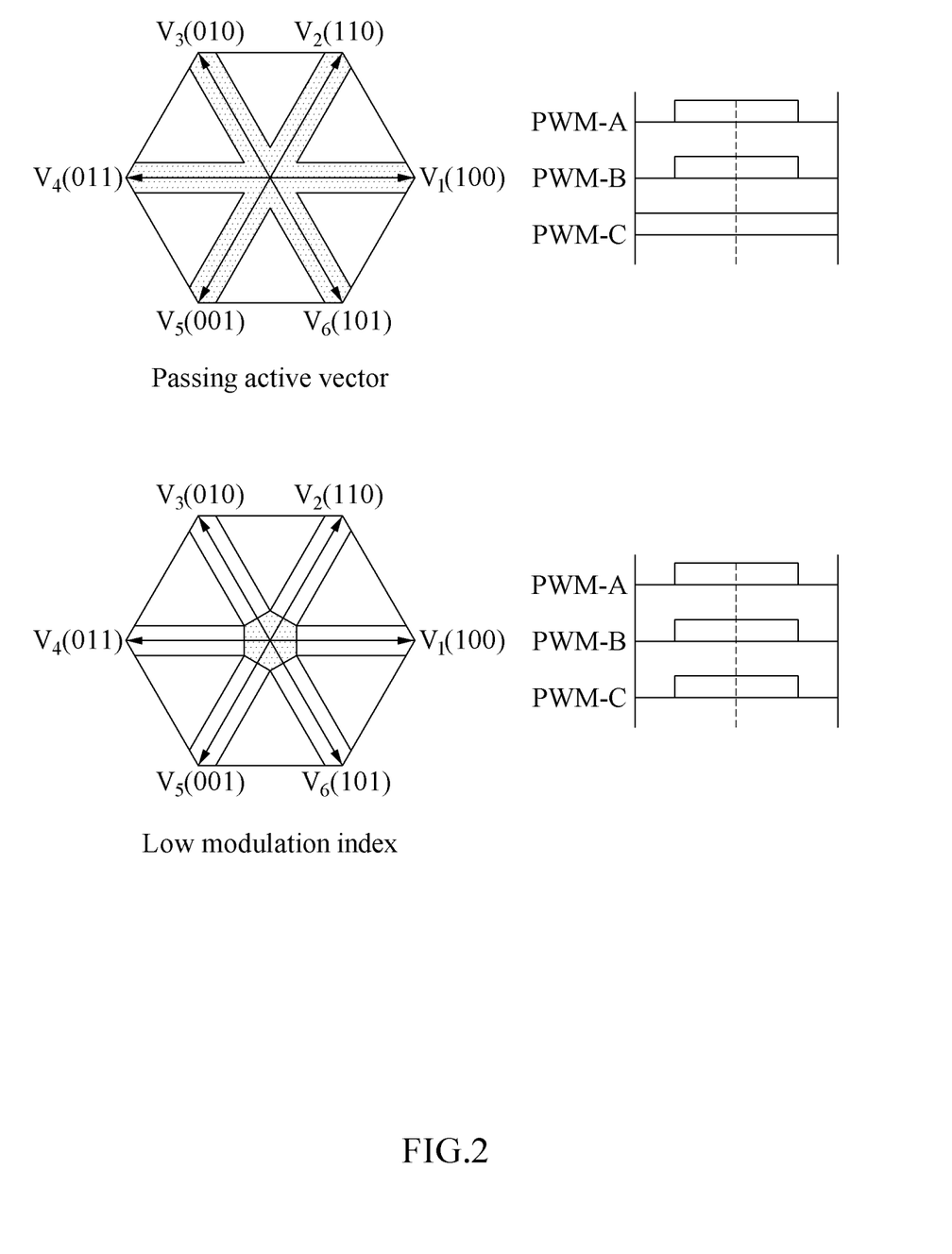
FIG. 2 is a conceptual diagram illustrating a current undetectable area of an inverter using a single current sensor in a space vector PWM scheme.

However, in the conventional method of using a single current sensor, a current undetectable area (e.g., a star area and a band area) is present as illustrated in FIG. 2. Therefore, the resistance ($R_{ds}$ on) value may not be modified in the current undetectable area. To solve this, a phase of a PWM signal needs to be shifted or torn in the current undetectable area of a single current sensor system. Here, there are disadvantages that noise occurs and a number of harmonics increases in the current and software becomes complicated. In addition, since a hardware space and device for the single current sensor system are additionally required to modify the resistance ($R_{ds}$ on) value, price competitiveness may be degraded.

PRIOR ART DOCUMENT (Patent Document 1) Korean Patent Laid-Open Publication No. 10-2011-0078968 (2011.07.07)
Technical Subject
To outperform the aforementioned issues occurring when modifying a resistance ($R_{ds}$ on) value using a single current sensor, at least one example embodiment provides a 3-phase pulse width modulation (PWM) inverter system that may estimate a junction temperature in real time using a switch junction temperature estimation technique and may estimate a current resistance ($R_{ds}$ on) value based on a resistance ($R_{ds}$ on) map that considers the junction temperature, current, and a voltage ($V_{gs}$) between a gate and a source and a method that calculates current using the resistance ($R_{ds}$ on) value and a voltage drop across a switch.
Solution
A current measurement method of a 3-phase pulse width modulation (PWM) inverter using a real-time switch junction temperature estimation technique according to an example embodiment includes calculating a power loss of a switch of the inverter; estimating a junction temperature ($T_j$) of the switch using a thermal equivalent circuit based on a Negative Temperature Coefficient (NTC) resistance; estimating a resistance ($R_{ds}$ on) value between both ends of a drain and a source using a resistance ($R_{ds}$ on) map based on the junction temperature ($T_j$), drain current ($I_D$), and a voltage ($V_{gs}$) based on a gate and the source; in response to turn-on of a lower switch of the inverter, measuring a voltage ($V_{ds}$) occurring between both ends of the drain and the source and the voltage ($V_{gs}$) between the gate and the source; calculating current based on the estimated resistance ($R_{ds}$ on) value and the measured voltage ($V_{ds}$) between the drain and the source; and using a value of the calculated current as a control signal of the inverter.

The calculating of the power loss of the switch of the inverter may include using a power loss energy map that calculates conduction loss energy and switching loss energy using a power parameter in the inverter as an input.

The calculating of the power loss of the switch of the inverter may include calculating a conduction voltage ($V_{sat}$) and an instantaneous loss power value at a time of switching through the power loss energy map and estimating a total power loss of the switch as a sum of a conduction loss power value and a switching loss power value derived based on the calculated power value.

The estimating of the junction temperature ($T_j$) of the switch may include calculating a thermal impedance of the thermal equivalent circuit based on a time constant of the thermal equivalent circuit from the NTC resistance to a junction unit of the switch. Also, the estimating of the junction temperature ($T_j$) of the switch may include estimating a temperature difference from the NTC resistance to the junction unit of the switch based on the thermal impedance and the power loss of the switch, and estimating the junction temperature ($T_j$) based on the estimated temperature difference.

The estimating of the resistance ($R_{ds}$ on) value may include estimating the current resistance ($R_{ds}$ on) value through the resistance ($R_{ds}$ on) map that is pre-generated based on a datasheet of the switch using the junction temperature ($T_j$), the drain current ($I_D$), and the voltage ($V_{gs}$) between the gate and the source as input values.

A 3-phase PWM inverter system using a real-time switch junction temperature estimation technique according to an example embodiment includes a voltage measurer configured to, in response to turn-on of a lower switch of an inverter, measure a voltage ($V_{ds}$) occurring between both ends of a drain and a source and a voltage ($V_{gs}$) between a gate and the source; a power loss calculator configured to calculate a power loss of a switch of the inverter and to estimate a junction temperature ($T_j$) of the switch using a thermal equivalent circuit based on a Negative Temperature Coefficient (NTC) resistance; a current calculator configured to estimate a resistance ($R_{ds}$ on) value between both ends of the drain and the source using a resistance ($R_{ds}$ on) map based on the junction temperature ($T_j$), drain current ($I_D$), and the voltage ($V_{gs}$) between the gate and the source and to calculate current based on the estimated resistance ($R_{ds}$ on) value and the measured voltage ($V_{ds}$) between the drain and the source; and a PWM controller configured to use a value of the calculated current as a control signal of the inverter.

The power loss calculator may be configured to use a power loss energy map that calculates conduction loss energy and switching loss energy using a power parameter in the inverter as an input.

The power loss calculator may be configured to calculate a conduction voltage ($V_{sat}$) and an instantaneous loss power value at a time of switching through the power loss energy map and to estimate a total power loss of the switch as a sum of a conduction loss power value and a switching loss power value derived based on the calculated power value.

The power loss calculator may be configured to calculate a thermal impedance of the thermal equivalent circuit based on a time constant of the thermal equivalent circuit from the NTC resistance to a junction unit of the switch. Also, the power loss calculator may be configured to estimate a temperature difference from the NTC resistance to the junction unit of the switch based on the calculated thermal impedance and power loss of the switch and to estimate the junction temperature ($T_j$) based on the estimated temperature difference.

The current calculator may be configured to estimate the current resistance ($R_{ds}$ on) value through the resistance ($R_{ds}$ on) map that is pre-generated based on a datasheet of the switch using the junction temperature ($T_j$), the drain current ($I_D$), and the voltage ($V_{gs}$) between the gate and the source as input values.

Effect

A current measurement method of a 3-phase pulse width modulation (PWM) inverter according to an example embodiment and a system to which the same is applied may measure current without a current sensor, which differs from the related art, and may easily control load since an error according to modification does not occur as in the related art and it is possible to continuously measure current.

DETAILED DESCRIPTION

Terms used herein are briefly described and the present invention is described in detail.

Although the terms used herein use currently widely used general terms as possible that are selected into consideration of functions in the present invention, they may vary depending on the intent or precedent of one of ordinary skill in the art, the emergence of new technology, and the like. In addition, in a specific case, there is a term arbitrarily selected by the applicant. In this case, the meaning thereof will be described in detail in a corresponding description portion of the invention. Therefore, the term used herein should be defined based on the meaning of the term and the overall content of the present invention rather than a simple name of the term.

When it is described in the overall specification that a portion "comprises/includes" a predetermined component, it represents that the portion may further include another component rather than excluding the other component unless clearly stated otherwise. Also, a term, such as "unit" and the like described herein, may represent a unit for processing at least one function or operation, which may be implemented as hardware or a combination of hardware and software.

In the following, example embodiments are described in detail with reference to the accompanying drawings such that one of ordinary skill in the art to which the present invention pertains may easily carry out the example embodiments. However, the present invention may be implemented in various different forms and is not limited to the example embodiments. To clearly explain the present invention, a portion irrelevant to the description is omitted in the drawings and like reference numerals refer to like elements throughout the present specification.

Hereinafter, the present invention is described in detail with reference to the accompanying drawings.

Figure 3:
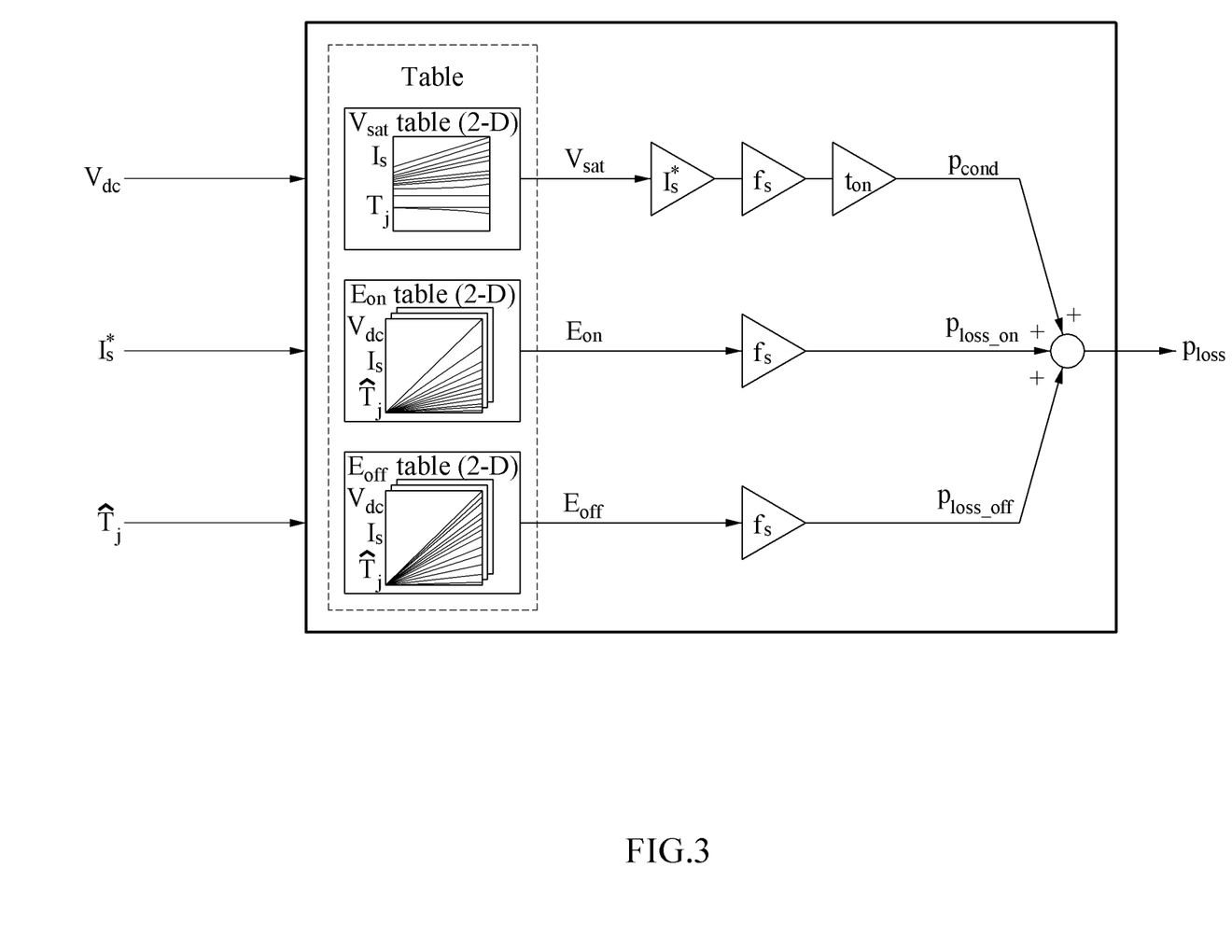
FIG. 3 is a conceptual diagram illustrating a power loss calculation process of a switch.

FIG. 3 is a block diagram illustrating a power loss calculation process of a switch.

Referring to FIG. 3, in an operation of calculating a power loss according to an example embodiment, a conduction voltage ($V_{sat}$) and an instantaneous loss power ($E_{on}$, $E_{off}$) value at a time of switching (on/off) may be calculated through a power loss energy map that uses power parameters ($V_{dc}$, $T_j$, $I_S$) reconstructed based on a datasheet of a switching element as input. A conduction loss power ($V_{sat}*I_S*f_s$) value and a switching loss power ($E_{on}*f_s$, $E_{off}*f_s$) value may be calculated using the instantaneous loss power value calculated through the above process, and a total loss power may be calculated by summing the same.

Figure 4:
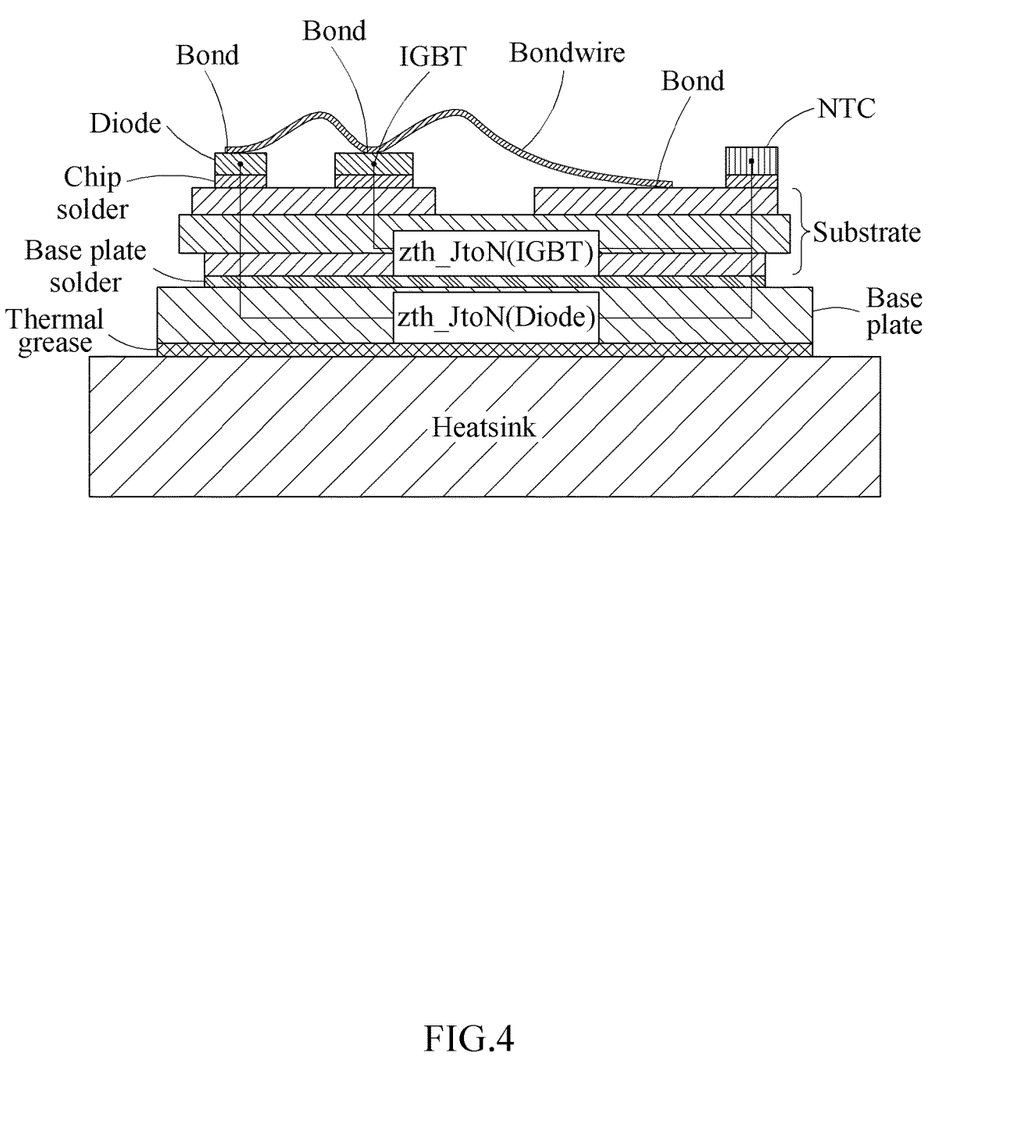
FIG. 4 is a view illustrating a thermal equivalent circuit using a Negative Temperature Coefficient (NTC) of a switch as a base.

FIG. 4 illustrates a thermal equivalent circuit using a Negative Temperature Coefficient (NTC) resistance of a switching module as a base and represents a thermal equivalent circuit from the NTC resistance to an Insulated Gate Bipolar Transistor (IGBT) and a diode based on a cross-sectional view of an IGBT module.

A thermal equivalent circuit in a generally used IGBT module has been used based on a vertical layout that uses a coolant as a base. However, using the existing method, it is difficult to consider a time constant of the thermal equivalent circuit including a convective heat transfer coefficient that varies according to a change in a flow rate and a temperature of the coolant and the inverter may be unaware of the flow rate and the temperature of the coolant. Therefore, a practical application is difficult.

In contrast, referring to FIG. 4, in an operation of estimating a junction temperature ($T_j$) according to an example embodiment, a thermal impedance of the thermal equivalent circuit from an IGBT to an NTC resistance may be calculated by acquiring a time constant of the thermal equivalent circuit from the IGBT to the NTC resistance. A temperature difference from the IGBT to the NTC resistance may be calculated based on the thermal impedance and the total loss power calculated through the aforementioned process and the junction temperature ($T_j$) may be estimated by summing the temperature difference with a temperature value measured at the NTC resistance. That is, by applying a temperature of the NTC resistance that varies according to an external environment to a process of estimating the junction temperature ($T_j$), it is possible to indirectly apply an effect from an external parameter capable of causing an estimation error of the junction temperature ($T_j$) and to more accurately estimate the junction temperature ($T_j$).

Figure 5:
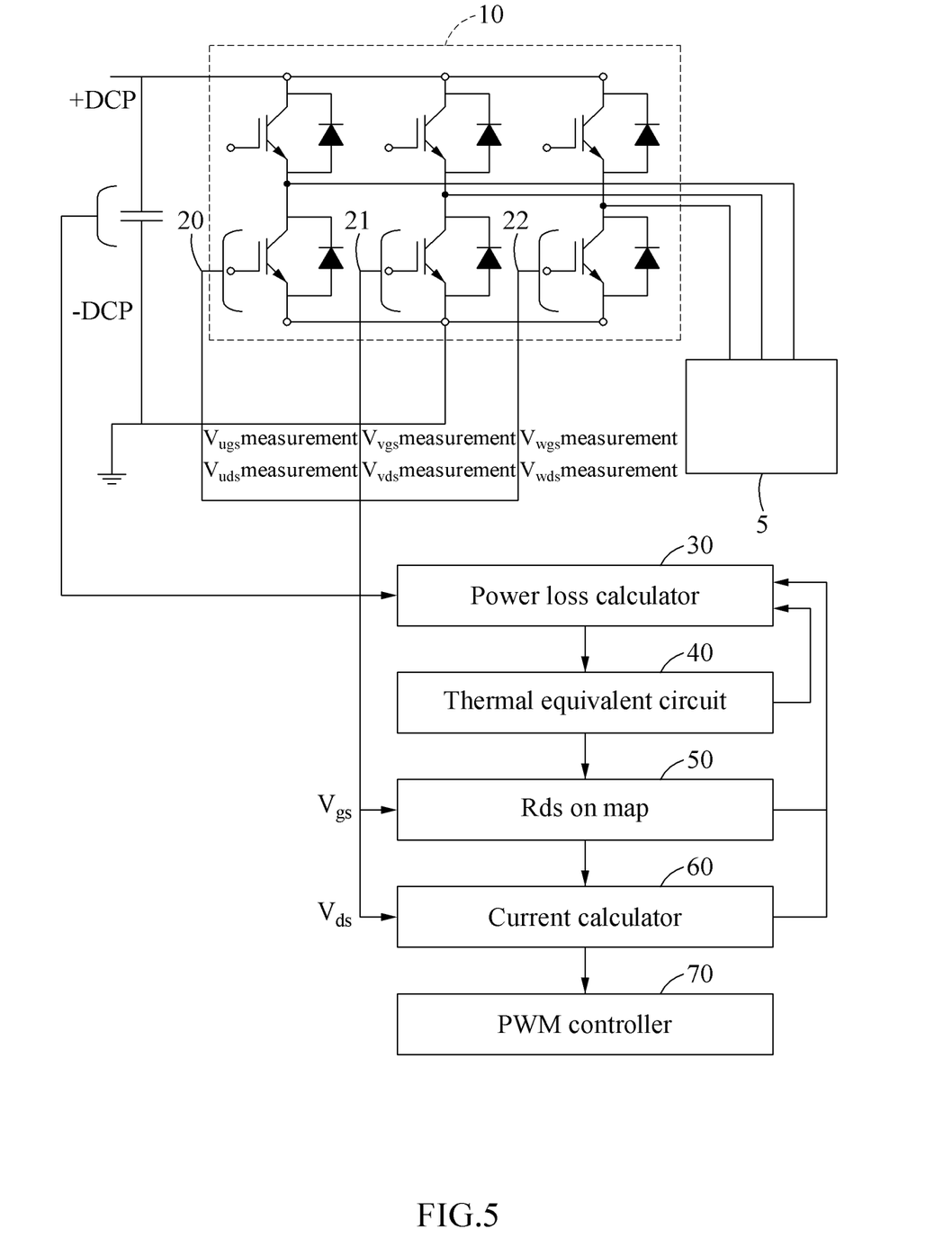
FIG. 5 is a conceptual diagram of a 3-phase PWM inverter system according to an example embodiment.

FIG. 5 is a conceptual diagram of a 3-phase PWM inverter system according to an example embodiment.

Referring to FIG. 5, the 3-phase PWM inverter system according to an example embodiment refers to as a 3-phase PWM inverter and may include an inverter 10 configured to receive a rectified voltage of a direct current (DC) link end and to convert the same to an alternating current (AC) power source, a voltage measurer 20 configured to measure a voltage ($V_{ds}$) between a drain and a source and a voltage ($V_{gs}$) between a gate and the source, a power loss calculator 30 configured to measure a junction temperature ($T_j$) based on a power loss of a switch and a thermal equivalent circuit 40 of an NTC resistance base, a current calculator 60 configured to estimate a resistance ($R_{ds}$ on) value between both ends of the drain and the source using a resistance map 50 and to calculate current, and a PWM controller 70 configured to use a result value of the current calculator as a control signal of the inverter.

The voltage measurer 20 according to an example embodiment may detect a potential difference between both ends of a drain and a source using an amplifier to detect a voltage ($V_{ds}$) between a drain and a source of a lower switch of the inverter and a voltage signal output by passing through the amplifier may be input to a micro controller unit (MCU) as an analog signal and converted to a digital signal through an analog-to-digital (A/D) converter. The voltage measurer 20 may convert the corresponding digital signal to an amount of voltage drop between both ends of the drain and the source and may input the same to a current calculator 60. Also, the voltage measurer may measure the voltage ($V_{gs}$) between the gate and the source and may output the same to the resistance ($R_{ds}$ on) [$V_{gs}$, $T_j$, $I_D$] map 50.

The power loss calculator 30 according to an example embodiment may pre-generate an energy map about a conduction loss and a switching loss using a power parameter given to the switch as an input and may calculate the power loss for power parameters ($V_{dc}$, $T_j$, $I_S$). Also, the power loss calculator may calculate the junction temperature ($T_j$) of the switch through the thermal equivalent circuit 40 of the NTC base.

The current calculator 60 according to an example embodiment may estimate a current resistance ($R_{ds}$ on) value through the resistance ($R_{ds}$ on) [$V_{gs}$, $T_j$, $I_D$] map 50 that considers the junction temperature ($T_j$) calculated by the power loss calculator 30, current, and the voltage ($V_{gs}$) between the gate and the source as input values. Also, the current calculator may calculate a current value for control of the inverter based on the estimated resistance ($R_{ds}$ on) value and the voltage measured through the voltage measurer 20.

Figure 6:
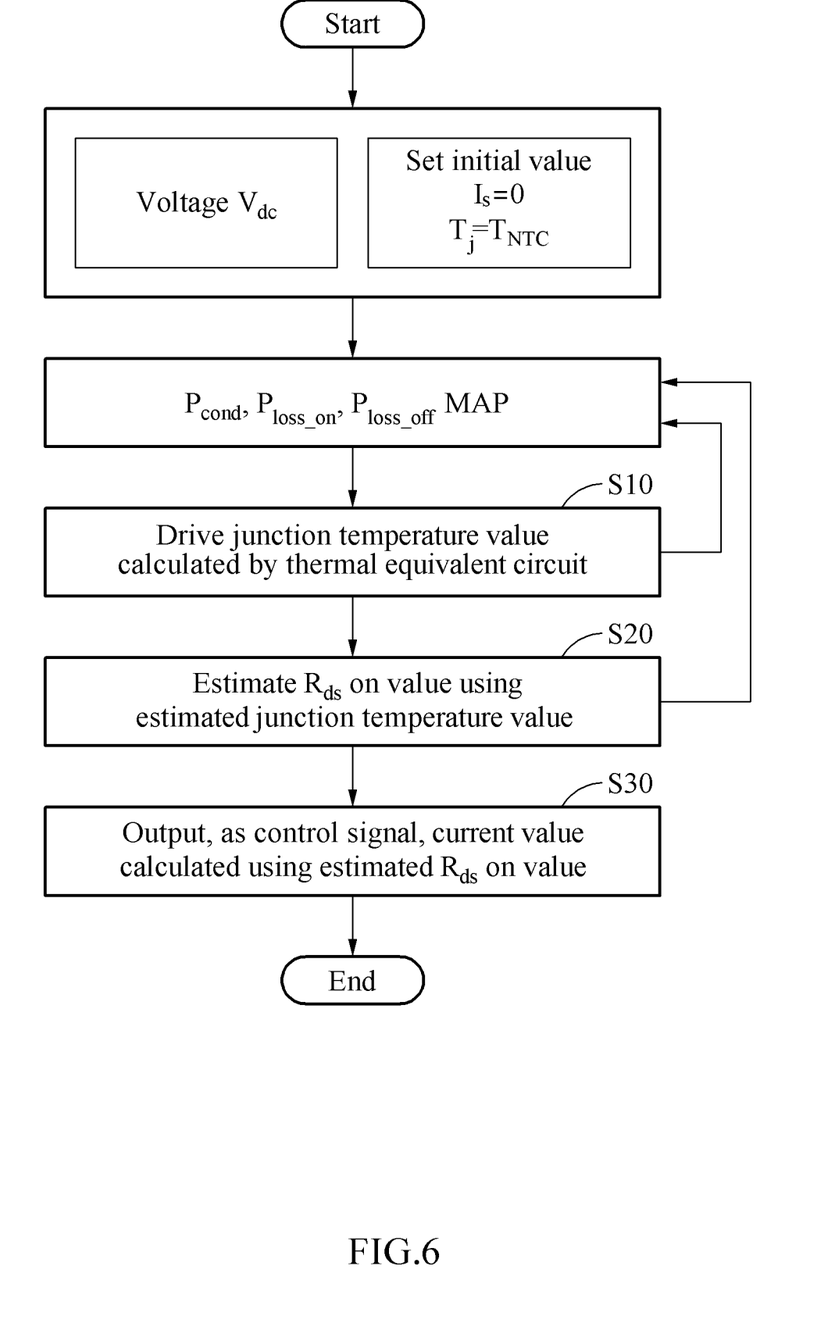
FIG. 6 is a control flowchart of a 3-phase PWM inverter system according to an example embodiment.

FIG. 6 is a control block diagram of a 3-phase PWM inverter system according to an example embodiment.

Referring to FIG. 6, in a control process of a system according to an example embodiment, factors required by the power loss calculator 30, that is, a voltage of a DC link end, an initial value of phase current, and an initial value of a junction temperature ($T_j$) are set. Before initiating control, a PWM signal is not output and thus, an initial value of current flowing in a phase becomes zero. Also, the initial value of the junction temperature ($T_j$) has a temperature similar to an ambient temperature in a state in which an amount of consumption consumed is absent. Therefore, a temperature measured in real time with an NTC may be set as an initial value.

In a state in which the initial value is set, an operation of the power loss calculator 30 that calculates a power loss amount of a switch module is performed. In operation S10, an amount of loss power initially consumed is calculated and input again to a thermal equivalent circuit to estimate a junction temperature ($T_j$) of a switch and the current junction temperature ($T_j$) of the switch is output. In operation S20, the junction temperature ($T_j$) of the switch is input to a map that estimates a resistance ($R_{ds}$ on) value and is output as the resistance ($R_{ds}$ on) value currently estimated. Initially flowing phase current is 0. Therefore, if a current control unit of the inverter operates once using 0 as an initial value, the switch is conducted once. Here, in operation S30, a voltage drop amount of a lower switch is detected and flowing current is calculated through a relation equation with the estimated resistance ($R_{ds}$ on) value.

The current calculated through the aforementioned process is input again to the power loss calculator 30 and calculated as a power loss of the switch and the junction temperature ($T_j$) of the switch is estimated through the thermal equivalent circuit. The estimated junction temperature ($T_j$) enables estimation of the resistance ($R_{ds}$ on) value that varies according to a current junction temperature ($T_j$) of the switch and the estimated resistance ($R_{ds}$ on) value may be fed back to the current calculator 60 and calculated as current. The system according to an example embodiment has a form of a closed-loop system as described above and reduces an error of current calculated by continuously estimating the current loss and the junction temperature ($T_j$) of the switch and the resistance ($R_{ds}$ on) value.

Unlike an existing system, the present invention may not require even a single current sensor and may detect current in all areas through the aforementioned current measurement process. Also, in terms of hardware, a design may be performed more efficiently in using a space and price competitiveness may be secured.

The foregoing description of the present invention is provided as an example and one of ordinary skill in the art to which the present invention pertains may understand that modifications may be easily made in different forms without departing from the technical spirit or essential features of the present invention. Therefore, it should be understood that the example embodiments are illustrative in all respects and not restrictive. For example, each component described in a singular form may be implemented in a distributed manner. Likewise, components described as distributed may be implemented in a combined manner.

The scope of the present invention is indicated by the following claims rather than the detailed description and all changes or modifications derived from the meaning and the scope of the claims and the equivalents thereof should be construed as being included in the scope of the present invention.

EXPLANATION OF SYMBOLS 1,10: inverter
4: current modifier
5: Y-connected load
6,7,8,20: voltage measurer between a drain and a source
30: power loss calculator
40: thermal equivalent circuit
50: $R_{ds}$ on ($V_{gs}$, $T_j$, $I_D$) map
60: current calculator
70: PWM controller

What is claimed is:

1. A current measurement method of a 3-phase pulse width modulation (PWM) inverter using a real-time switch junction temperature estimation technique, the current measurement method comprising:
    calculating a power loss of a switch of the inverter by calculating conduction loss energy and switching loss energy using a power loss energy map corresponding to each of a plurality of power parameters in the inverter;
    estimating a junction temperature ($T_j$) of the switch using a thermal equivalent circuit based on a Negative Temperature Coefficient (NTC) resistance;
    estimating a resistance ($R_{ds}$ on) value between both ends of a drain and a source using a resistance ($R_{ds}$ on) map based on the junction temperature ($T_j$), drain current ($I_D$), and a voltage ($V_{gs}$) based on a gate and the source;
    in response to turn-on of a lower switch of the inverter, measuring a voltage ($V_{ds}$) occurring between both ends of the drain and the source and the voltage ($V_{gs}$) between the gate and the source;
    calculating current based on the estimated resistance ($R_{ds}$ on) value and the measured voltage ($V_{ds}$) between the drain and the source; and
    using a value of the calculated current as a control signal of the inverter
    wherein the estimating of the junction temperature ($T_j$) of the switch comprises calculating a time constant of the thermal equivalent circuit comprising the NTC resistance, an IGBT and a diode and calculating a thermal impedance of the thermal equivalent circuit using the calculated time constant and estimating the junction temperature ($T_j$) using the calculated thermal impedance and a calculated total power loss of the switch.

2. The current measurement method of claim 1, wherein the calculating of the power loss of the switch of the inverter comprises calculating a conduction voltage ($V_{sat}$) and an instantaneous loss power value at a time of switching through the power loss energy map and estimating a total power loss of the switch as a sum of a conduction loss power value and a switching loss power value derived based on the calculated power value.

3. The current measurement method of claim 1, wherein the estimating of the junction temperature ($T_j$) of the switch comprises estimating a temperature difference from the NTC resistance to the junction unit of the switch based on the calculated thermal impedance and power loss of the switch, and estimating the junction temperature ($T_j$) based on the estimated temperature difference.

4. The current measurement method of claim 1, wherein the estimating of the resistance ($R_{ds}$ on) value comprises estimating the resistance ($R_{ds}$ on) value through the resistance ($R_{ds}$ on) map that is pre-generated based on a datasheet of the switch using the junction temperature ($T_j$), the drain current ($I_D$), and the voltage ($V_{gs}$) between both ends of the gate and the source as input values.

5. A 3-phase pulse width modulation (PWM) inverter system using a real-time switch junction temperature estimation technique, the 3-phase PWM inverter system comprising:
    a voltage measurer configured to, in response to turn-on of a lower switch of the inverter, measure a voltage ($V_{ds}$) occurring between both ends of a drain and a source and a voltage ($V_{gs}$) between a gate and the source;
    a power loss calculator configured to calculate a power loss of a switch of the inverter by calculating conduction loss energy and switching loss energy using a power loss energy map corresponding to each of a plurality of power parameters in the inverter and to estimate a junction temperature ($T_j$) of the switch using a thermal equivalent circuit based on a Negative Temperature Coefficient (NTC) resistance;
    a current calculator configured to estimate a resistance ($R_{ds}$ on) value between both ends of the drain and the source using a resistance ($R_{ds}$ on) map based on the junction temperature ($T_j$), drain current ($I_D$), and the voltage ($V_{gs}$) between the gate and the source and to calculate current based on the estimated resistance ($R_{ds}$ on) value and the measured voltage ($V_{ds}$) between the drain and the source; and
    a PWM controller configured to use a value of the calculated current as a control signal of the inverter
    wherein the power loss calculator is configured to calculate a time constant of the thermal equivalent circuit comprising the NTC resistance, an IGBT and a diode and calculate a thermal impedance of the thermal equivalent circuit using the calculated time constant and estimate the junction temperature ($T_j$) using the calculated thermal impedance and a calculated total power loss of the switch.

6. The 3-phase PWM inverter system of claim 5, wherein the power loss calculator is configured to calculate a conduction voltage ($V_{sat}$) and an instantaneous loss power value at a time of switching through the power loss energy map and to estimate a total power loss of the switch as a sum of a conduction loss power value and a switching loss power value derived based on the calculated power value.

7. The 3-phase PWM inverter system of claim 5, wherein the power loss calculator is configured to estimate a temperature difference from the NTC resistance to the junction unit of the switch based on the calculated thermal impedance and power loss of the switch and to estimate the junction temperature ($T_j$) based on the estimated temperature difference.

8. The 3-phase PWM inverter system of claim 5, wherein the current calculator is configured to estimate the resistance ($R_{ds}$ on) value through the resistance ($R_{ds}$ on) map that is pre-generated based on a datasheet of the switch using the junction temperature ($T_j$), the drain current ($I_D$), and the voltage ($V_{gs}$) between both ends of the gate and the source as input values.

\* \* \* \* \*